(12) United States Patent
Sinclair

(10) Patent No.: US 6,285,607 B1
(45) Date of Patent: Sep. 4, 2001

(54) MEMORY SYSTEM

(75) Inventor: Alan Welsh Sinclair, Edinburgh (GB)

(73) Assignee: Memory Corporation PLC (GB)

( * ) Notice: Subject to any disclaimer, the term of this patent is extended or adjusted under 35 U.S.C. 154(b) by 0 days.

(21) Appl. No.: 09/647,194

(22) PCT Filed: Mar. 23, 1999

(86) PCT No.: PCT/GB99/00921

§ 371 Date: Oct. 20, 2000

§ 102(e) Date: Oct. 20, 2000

(87) PCT Pub. No.: WO99/50748

PCT Pub. Date: Oct. 7, 1999

(30) Foreign Application Priority Data

Mar. 27, 1998 (GB) .................................................. 9806687

(51) Int. Cl.[7] .................................................... G11C 7/00
(52) U.S. Cl. ................... 365/200; 365/230.01; 365/239; 365/189.01; 371/10.1; 371/10.2; 711/118
(58) Field of Search ............................ 365/200, 230.01, 365/239, 189.01; 371/10.1, 10.2; 711/118

(56) References Cited

U.S. PATENT DOCUMENTS

| | | | |
|---|---|---|---|
| 5,321,697 | * | 6/1994 | Fromm et al. ...................... 371/10.1 |
| 5,544,312 | * | 8/1996 | Hasbun et al. ................... 395/183.18 |
| 5,644,539 | * | 7/1997 | Yamagami et al. ................... 365/200 |

* cited by examiner

Primary Examiner—David Nelms
Assistant Examiner—Connie C. Yoha
(74) Attorney, Agent, or Firm—Gifford, Krass, Groh, Sprinkle, Anderson & Citkowski, P.C.

(57) ABSTRACT

A memory system (10) incorporating a plurality of memory devices (42) at least one of which has a defective location. Defects are mapped in a non-volatile memory (46). Data structures are divided into portions which are respectively stored in different ones of the memory devices (42). The controller (17) of the system accesses the non-volatile memory so as to generate on a per device basis an address corresponding to a non-defective location in that device. In this system, different addresses may therefore be applied to different ones of the devices (42) when a data structure is written to or read from the memory devices.

12 Claims, 5 Drawing Sheets

Chip Memory Space with Defects

Chip Dcell Map with Defects

| DRow | Dcell_G | Dcell Map | | | | | | | | | | | | | | | |
|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 |
| 0 | 15 | 0 | 0 | 0 | 0 | 0 | 0 | 0 | 0 | 0 | 0 | 0 | 0 | 0 | 0 | 1 | 0 |
| 1 | 29 | 0 | 0 | 1 | 0 | 0 | 0 | 0 | 0 | 0 | 0 | 0 | 0 | 0 | 0 | 1 | 0 |
| 2 | 43 | 0 | 0 | 0 | 0 | 1 | 0 | 0 | 0 | 0 | 0 | 0 | 0 | 0 | 0 | 1 | 0 |
| 3 | 56 | 0 | 0 | 0 | 0 | 0 | 0 | 0 | 1 | 1 | 0 | 0 | 0 | 0 | 0 | 1 | 0 |
| 4 | 69 | 0 | 0 | 0 | 0 | 0 | 0 | 0 | 1 | 1 | 0 | 0 | 0 | 0 | 0 | 1 | 0 |
| 5 | 80 | 0 | 0 | 0 | 0 | 0 | 1 | 0 | 1 | 0 | 1 | 0 | 1 | 0 | 0 | 1 | 0 |
| 6 | 80 | 1 | 1 | 1 | 1 | 1 | 1 | 1 | 1 | 1 | 1 | 1 | 1 | 1 | 1 | 1 | 1 |
| 7 | 95 | 0 | 0 | 0 | 0 | 0 | 0 | 0 | 0 | 0 | 0 | 0 | 0 | 0 | 0 | 1 | 0 |

Dcell Map for Chip

MEMORY SYSTEM

FIELD OF THE INVENTION

The present invention relates to a memory system. In particular, the present invention relates to a memory system having a plurality of memory devices for storing and retrieving data structures, where the system is arranged and configured so that each data structure is divided into portions which are respectively stored in different memory devices.

DESCRIPTION OF THE RELEVANT PRIOR ART

Such memory systems, for example high performance solid state file storage devices, are already known and are used for storage and retrieval of data structures which are wider than the width of an individual addressable memory location in each individual memory device in the system. For example, a memory system may have 16 memory devices, each memory device storing 4 bits at each addressable memory location, so that data structures which are 64 bits wide may be stored (each 4 bit portion being stored in a different memory device). Thus, each data structure is stored in memory space spanning a plurality of memory devices with different portions of the data structure stored at the same address but in different devices. To store or retrieve a data structure, the address is applied simultaneously to each memory device in the memory system.

It is a disadvantage of this type of memory system that if one or more of the memory devices contains a defective memory location, then the only addresses which may be validly used for the entire memory system are the addresses which correspond to locations which are non-defective in all of the memory devices in the system. If each device has several different defective locations then this causes a dramatic reduction in memory capacity because a defective location in one device renders that location unusable in all of the devices. Thus, the percentage of usable locations in the memory system may be much lower than the percentage of usable memory locations in the device having most defective locations.

SUMMARY OF THE INVENTION

It is an object of the present invention to provide a new and improved memory system that obviates or mitigates the foregoing disadvantage.

It will be understood that the term "memory location" refers herein to the smallest number of bits or bytes which are independently addressed in each memory device; however, it will also be appreciated that the smallest number of bits that are addressed may be a multiple of the smallest number of bits that can be addressed. The term "cell" refers herein to a large plurality of memory locations, typically a cell may store, for example, 512 bytes or 8192 bytes. The term "width" when applied to a memory device herein refers to the number of bits or bytes in a memory location.

According to a first aspect of the present invention there is provided a memory system comprising:
a plurality of memory devices, where at least one of the memory devices has a defective memory location;
defect mapping means associated with each memory device having a defective location, for recording a representation of the location of the or each defective memory location;
a controller for accessing the defect mapping means and for writing data structures to and reading data structures from the memory devices; and
host interface means for conveying a host address and associated data structures between a host and the controller;

the system being arranged and configured so that data structures are divided into portions which are respectively stored in different memory devices, and, in use, the controller accesses the defect mapping means and thereby generates on a per device basis an address corresponding to a non-defective memory location within that device, whereby different addresses may be applied to different devices. By virtue of the present invention, a memory system typically having a high usable percentage of memory locations is obtained because each memory device is treated independently, which has the effect that defective memory locations only reduce the memory capacity of the device in which they are located.

According to a second aspect of the present invention there is provided a controller for use with a memory system having a plurality of memory devices, at least one of the devices having a defective memory location, and the system having defect mapping means associated with each memory device having a defective location, where the system is arranged and configured so that each data structure is divided into portions which are respectively stored in different memory devices, the controller being arranged for accessing the defect mapping means and thereby generating on a per device basis an address corresponding to a non-defective memory location within that device, whereby different addresses may be applied to different devices.

Preferably, the controller is arranged to organise the memory locations in each memory device into groups of memory locations (where each group is herein called a cell) so that if any cell contains a defective memory location then the entire cell is considered to be defective. This has the advantage that the defect granularity (cell size) of the memory system may be selected for optimum performance.

Preferably, the controller has a host address converter for converting the host address to an intermediate address, a translator for accessing the defect mapping means and constructing a memory address for a non-defective memory location for each device using the intermediate address and where necessary the defect mapping means, and a data transfer unit for applying the memory addresses to the respective devices.

Preferably, the translator also determines the number of data structures which may be transferred in an uninterrupted sequence. Conveniently, an indication of this number may be stored in a register or set of registers.

Preferably, the defect mapping means is in the form of a non-volatile memory such as a PROM (programmable read-only memory); conveniently the defect mapping means for each device having a defective location is located on a single a FLASH EPROM. Alternatively, but less preferred, the defect mapping means may be located on another type of storage medium such as a magnetic disk, a CD-ROM, or such like.

Preferably, the defect mapping means has an entry for each cell in each of the memory devices.

Preferably, the memory devices are DRAM devices.

Alternatively, the memory devices may be any convenient type of memory, such as SRAM, EEPROM or FLASH EPROM devices. According to a third aspect of the present invention there is provided a method of storing and retrieving data structures, where the data structures are divided into portions which are respectively stored in different memory devices; the method comprising the steps of:
providing a plurality of memory devices, where at least one of the memory devices has a defective memory location;
providing defect mapping means associated with each memory device having a defective location;

on a per device basis, determining with reference to any defect mapping means associated with that device an address of a non-defective memory location within that device;

applying the respective determined addresses to the devices; and either reading a data structure from or writing a data structure to the respective memory locations accessed by the respective determined addresses.

It will be appreciated that the determined addresses may be concatenated to form a single address having a plurality of fields.

BRIEF DESCRIPTION OF THE DRAWINGS

These and other aspects of the present invention will be apparent from the following specific description, given by way of example, with reference to the accompanying drawings, in which.

DETAILED DESCRIPTION OF THE PREFERRED EMBODIMENTS

Figure 1:
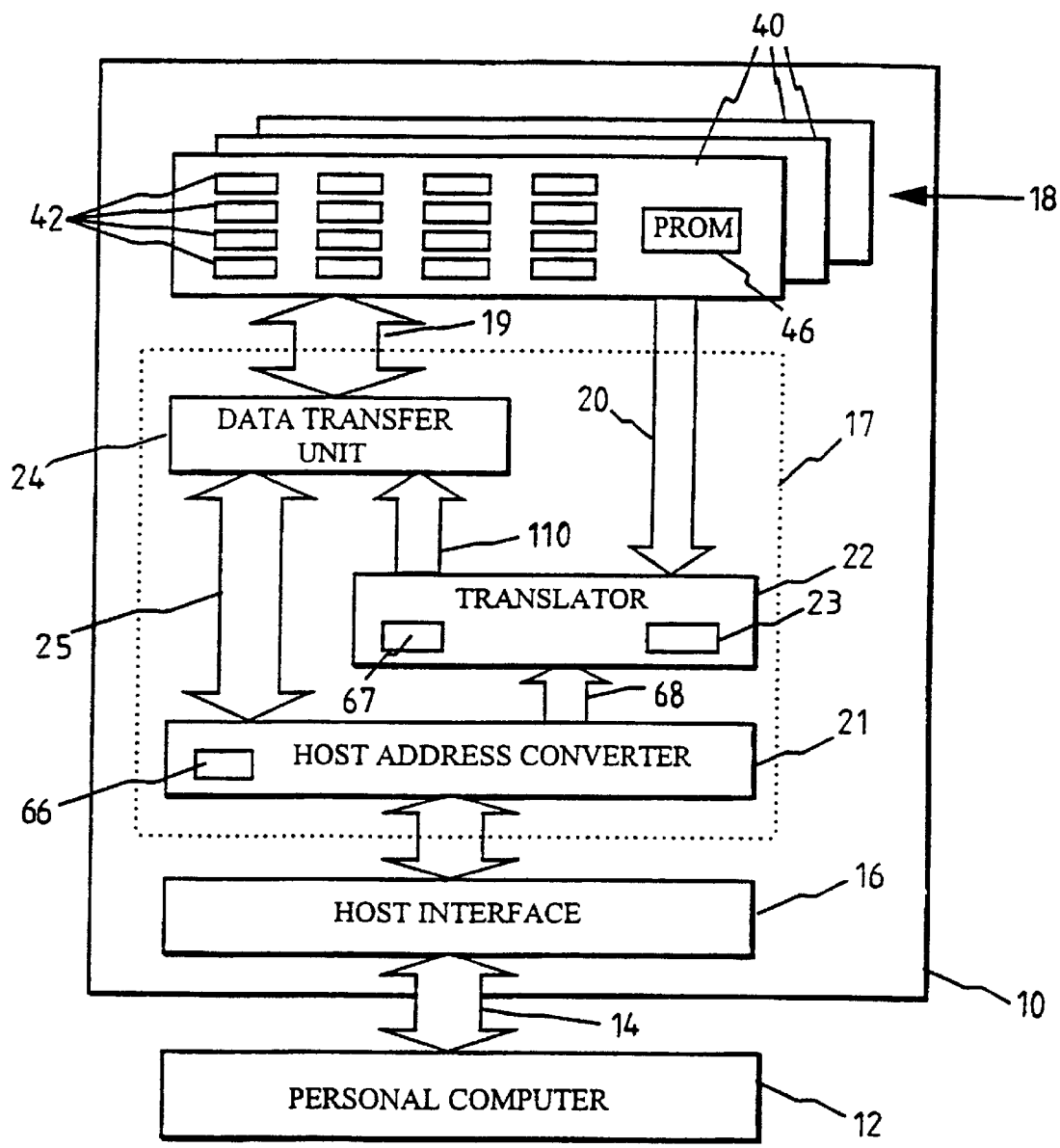
FIG. 1 is a block diagram of a memory system according to one embodiment of the present invention.

FIG. 1 shows a memory system 10 in accordance with one embodiment of the present invention. The system 10 is connected to a Personal Computer (PC) 12 (the host) by a standard PC interface 14.

The system 10 has host interface means 16 (in the form of electronic registers) for connecting to the standard PC interface 14 and for conveying a host address and associated data structures between the PC interface 14 and a controller 17.

The controller 17 comprises a host address converter 21; a translator 22 having a memory 23; and a data transfer unit 24. The controller 17 is connected between the host interface means 16 and a memory 18, and is connected to the memory 18 by a segmented channel 19 and a defect information channel 20. The controller 17 has hardware components (which will be described below) but also has software to perform certain translations (as will be described in more detail below). The host address converter 21 receives a host address and an indication of the amount of data to be transferred. The host address converter 21 then converts the host address to an intermediate address, which is a physical block address (PBA), and determines the total number of memory access cycles needed to transfer the data. The total number of access cycles is entered into a counter which is decremented by a master clock (within the host address converter 21) after each access cycle.

The translator 22 receives the PBA from the host address converter 21 and converts it into a memory address which is suitable for accessing memory 18. The data transfer unit 24 is hardware which is used to organise and arrange the memory addresses received from the translator 22 so that the memory addresses are suitable for accessing memory 18; the data transfer unit 24 also transfers data between memory 18 and host address converter 21 via data bus 25.

Figure 2:
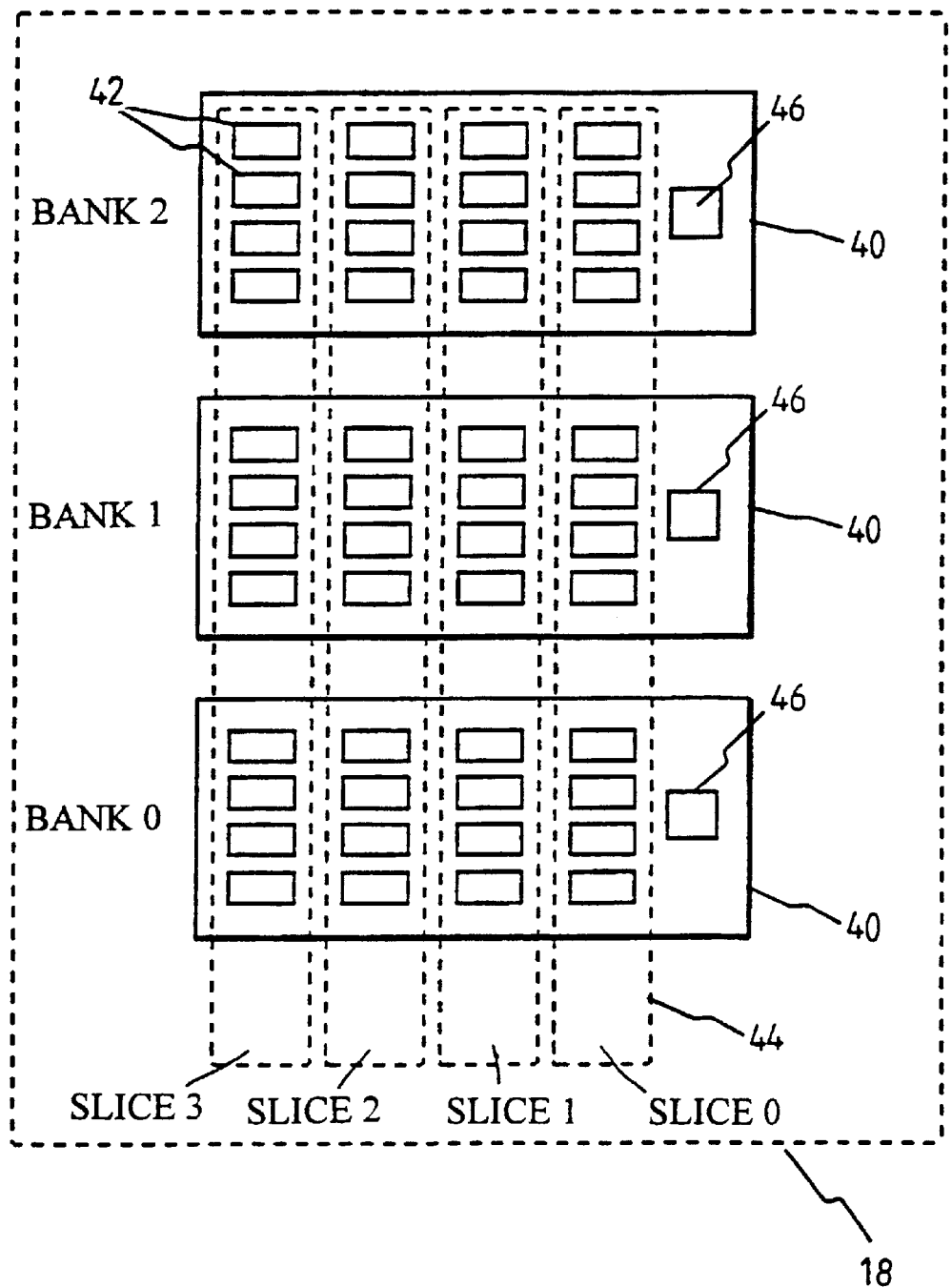
FIG. 2 is a block diagram showing a part of FIG. 1 in greater detail.

The memory 18 (as best seen in FIG. 2) comprises three memory cards 40 (which may be SIMMs, DIMMs, or such like), each card 40 being populated with sixteen DRAM memory devices 42 for storing data structures generated by the PC 12 (read/write blocks).

Each memory device 42 has a memory location width of sixteen bits. Each data structure is sixty-four bits wide and the memory 18 is arranged and configured so that there are four slices 44 (each slice 44 comprising four devices 42 in each card 40) each slice 44 storing a sixteen bit portion of each data structure at each memory location, so that for each memory location the four slices 44 together store sixty-four bit wide data structures.

As one or more of the devices 42 on each card 40 may have one or more defective locations, defect mapping means 46 (in the form of a programmable read-only memory (PROM)) may be required to store a representation of the defective locations on that card 40. In most systems, defect mapping means 46 will be required for each card 40.

In some embodiments, the memory system 10 may perform a memory test cycle to determine which locations in the memory 18 are defective. In other embodiments, the cards 40 may be pre-formatted so that the defect mapping means 46 are programmed to represent the defective memory locations. In other embodiments the controller may update the defect mapping means 46 if locations become defective during operation of the device.

The segmented channel 19 is arranged into four segments, one for each slice 44. The segmented channel 19 therefore provides four sets of address lines for addressing the four different slices 44 and four sets of data lines to convey data to and from the four slices 44, so that each slice 44 can be individually accessed.

Figure 3:
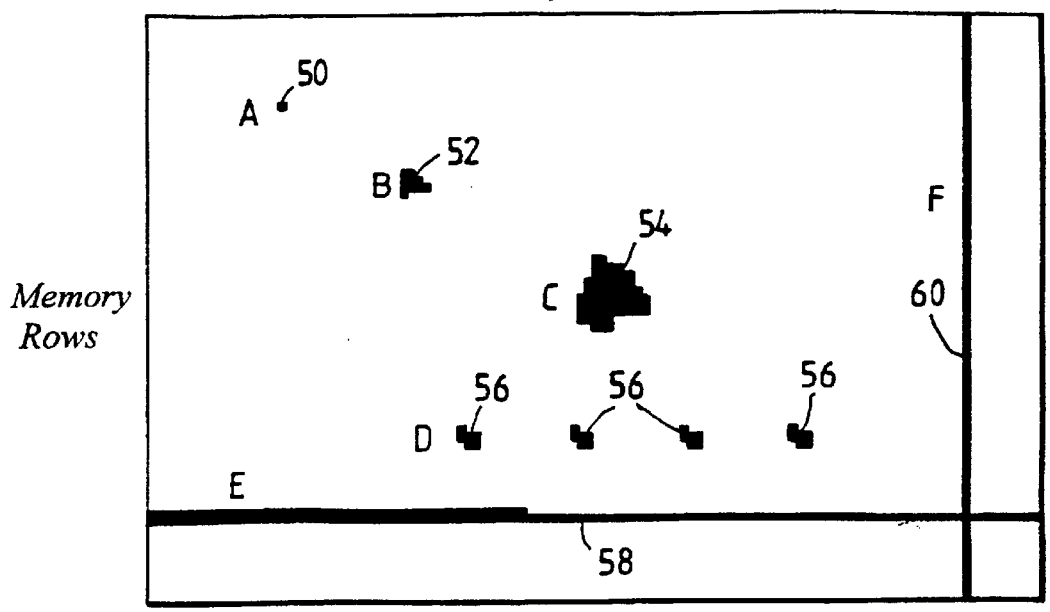
FIG. 3 illustrates different configurations of defects which may be present in the memory space of the memory system of FIG. 1.

FIG. 3 shows the memory space of a device 42 and different configurations of defective locations that may occur within such a device 42, such as point 50 (i.e. a simple single defective location), small cluster 52, large cluster 54, repeating cluster 56, row 58 and column 60 defects. For clarity, the size of the defective locations has been enlarged relative to the memory space.

Figure 4:
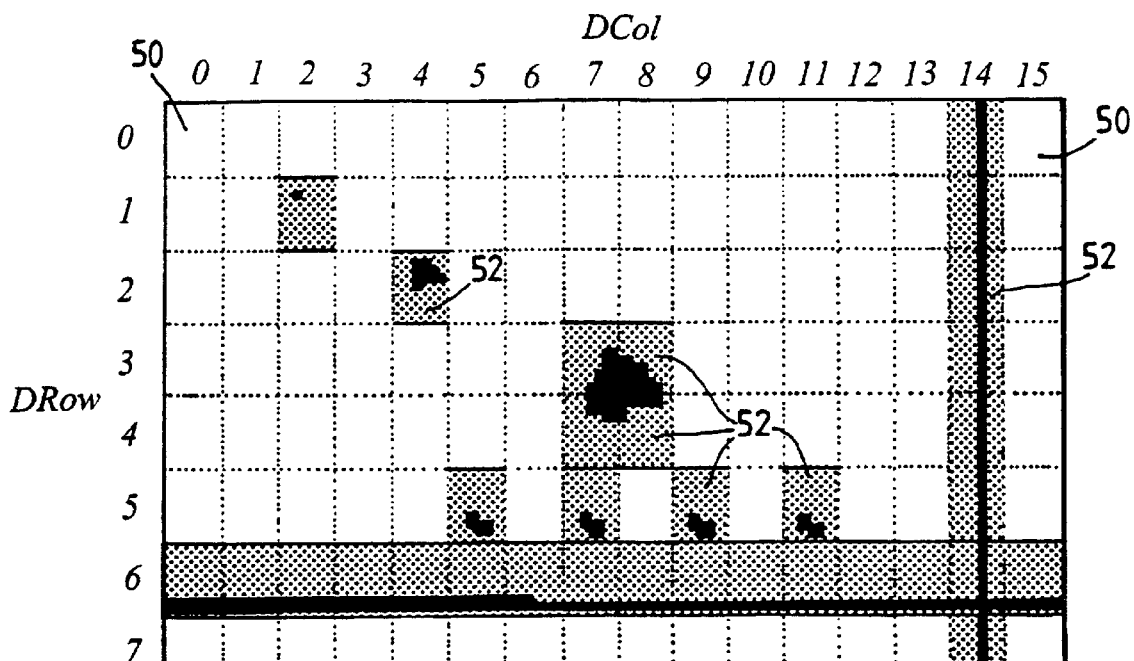
FIG. 4 illustrates the memory space of FIG. 3 subdivided into cells to form a cell map.

The memory space for each device 42 is arranged into a cell map, where the cell map comprises an array of rectangular groups of memory locations called cells 50, as shown in FIG. 4. A cell 50 is the minimum addressable unit which can be defined as defective, so where a cell 50 contains a defective location, that cell 50 is considered to be a defective cell 52. For illustrative purposes, FIG. 4 shows a sixteen by eight array of cells 50; however, the memory space of a device 42 in practical embodiments will usually have a much larger array of cells 50.

Figures 5, 6:
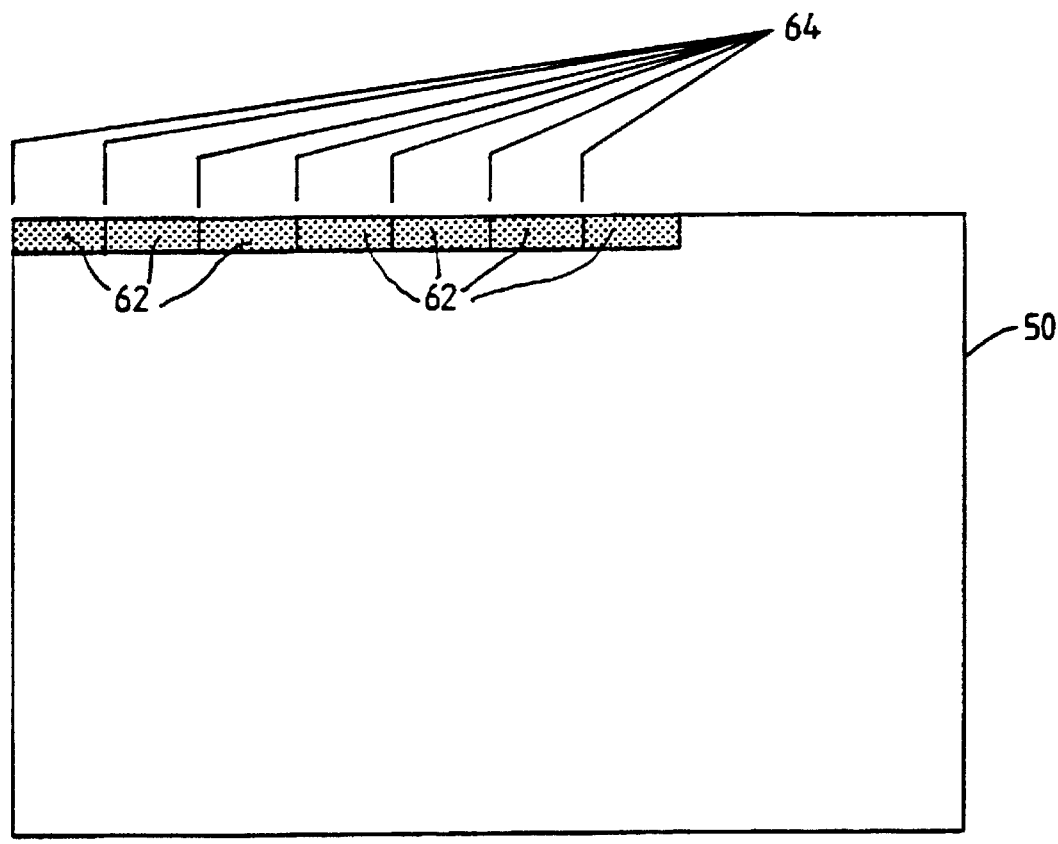
FIG. 5 is a table illustrating a representation of the cell map of FIG. 4.
FIG. 6 illustrates the memory space of a detail of FIG. 1, having data structures stored therein.

The PROM 46 on each card 40 is programmed with a stream of bits representing the cell map for each device 42 on that card 40. FIG. 5 is a table illustrating a representation of the cell map of FIG. 4. In FIG. 5 the stream of bits is shown in a grid pattern corresponding to the cell pattern of FIG. 4. If a cell 50 is usable then the number zero is inserted in the relevant row and column; however, if a cell is unusable (because it is a defective cell 52) then the number one is inserted in the relevant row and column. For example, row zero column zero has a zero because the cell at that position is usable, whereas, row zero column fourteen has a one because the cell at that position is not usable. FIG. 5 has an additional column 61 labelled Dcell_G; this column has an entry for each row that indicates the total number of usable cells 50 up to the end of that row. This information (in the Dcell_G column) is useful as an aid in calculating how many usable cells exists below a certain address, as will be described in more detail below.

In use, the PC 12 writes (reads) data blocks to (from) the memory system 10, these data blocks are typically 512 bytes in size. The host address converter 21 writes (reads) these data blocks in sixty-four bit wide words (data structures), with sixteen bits of each word being written to (read from) each slice 44. Thus, for every data block stored, each slice contains sixty-four addressable locations, each location storing sixteen bits, so that all four slices together store 512 bytes.

FIG. 6 illustrates the address space of a single usable cell 50 having seven portions 62 of data structures stored therein, each portion 62 being sixteen bits in length. The portions 62 of data structures are stored contiguously in one row; the start of each portion 62 being identified in FIG. 6 by reference numeral 64. For illustrative purposes, seven portions 62 are shown and these portions are greatly enlarged with respect to the row length; however, once an entire data block has been stored then there will be sixty-four portions 62 stored in each slice 44.

During initialisation of the memory system 10, the contents of the PROMs 46 (the stream of bits) for each card 40 are loaded into memory 23 (FIG. 1) via the defect information channel 20 (FIG. 1), which is a serial channel in this embodiment. During operation of the memory system 10, when the PC 12 writes (reads) a data block to (from) the memory system 10 the PC 12 supplies the memory system 10 with a host address in the form of a logical block address (LBA) corresponding to the data block to be transferred. The LBA is the logical serial number allocated to that block by the operating system in the PC 12. Generally, the PC 12 will transfer a sequence of data blocks, in which case the PC 12 provides the address of the first block in the sequence plus the number of logically consecutive blocks in the sequence to be transferred.

This LBA is conveyed to the host address converter 21 via the PC interface 14 and the host interface 16, and the host address converter 21 translates the LBA to a physical block address (PBA).

The PBA is the start address of a data structure within a data block in defect-free address space. This PBA is an intermediate address which indicates the relative position of the first data structure relative to a block, and also indicates the relative position of the first block of the sequence to the blocks in defect-free space. The PBA relates to defect-free address space, which is a virtual address space, so the PBA cannot be used to address the memory 18 directly.

The PBA is the same for all slices 44 because the PBA does not take account of defective cells 52 within slices 44.

Typically, the ordering of data blocks in physical address space will be the same as the ordering of data blocks in logical address space, so the host address converter 21 can convert the LBA to a PBA using a predetermined (software) algorithm which multiplies the LBA by the physical block-size. The number of consecutive logical blocks to be transferred is also translated by the host address converter 21 to the number of data structures contained in the consecutive logical blocks. The total number of data structures to be transferred is equivalent to the number of memory access cycles required for the transfer because a data structure is accessed in a single cycle of the memory system 10. The host address converter 21 loads an internal total transfer counter 66 with this number (of data structures) and decrements the counter 66 (after each memory access cycle) as the transfer proceeds. When the counter 66 stores the value zero then the transfer of the sequence of data blocks has been completed.

To control the transfer length, the host address converter 21 may also perform functions such as error checking/correcting code (ECC) generation and checking, and memory refresh control (because DRAM devices require periodic refreshing).

The translator 22 performs a translation of the PBA (which is the start address) generated by the host address converter 21 to a (starting) memory address suitable for accessing memory 18. The translator 22 determines the maximum number of data structures which can be transferred before the transfer has to be halted (for example, because a defective cell 52 is encountered, or a new memory access cycle is required) and the translator 22 loads burst transfer counters 67 with this number.

Figure 7:
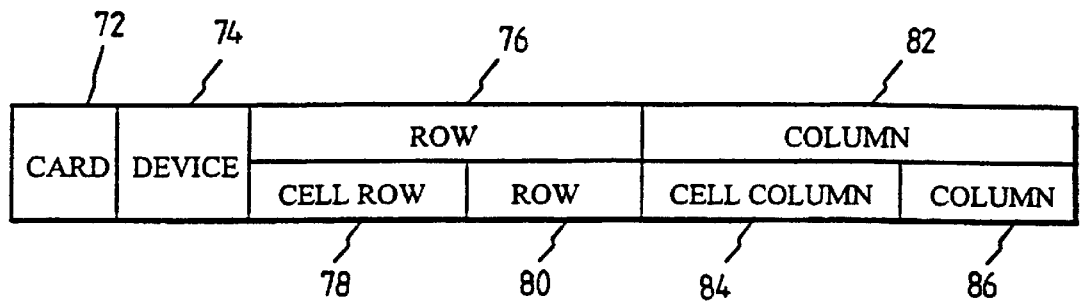
FIG. 7 illustrates the format of a type of address used in the system of FIG. 1.

A typical PBA has the format shown in FIG. 7. The PBA 70 has a card field 72 identifying which card 40 in the memory system 10 is being addressed; a device field 74 identifying which device 42 in the card 40 is being addressed; a row field 76 having cell row 78 and row 80 sub-fields; and a column field 82 having cell column 84 and column 86 sub-fields, the row 76 and column 82 fields are for identifying a particular location within the device 42 being addressed.

The host address converter 21 conveys the PBA 70 to the translator 22 via address bus 68. The translator 22 constructs a memory system address (MSA) 90 for the PBA 70. The MSA 90 is an address for accessing a non-defective region in each slice 44 within the physical memory address space. As the physical memory address space may contain defective regions, the MSA is a complex address having an independent address field for each slice 44, and these fields may be different for each memory slice 44.

Figure 8:
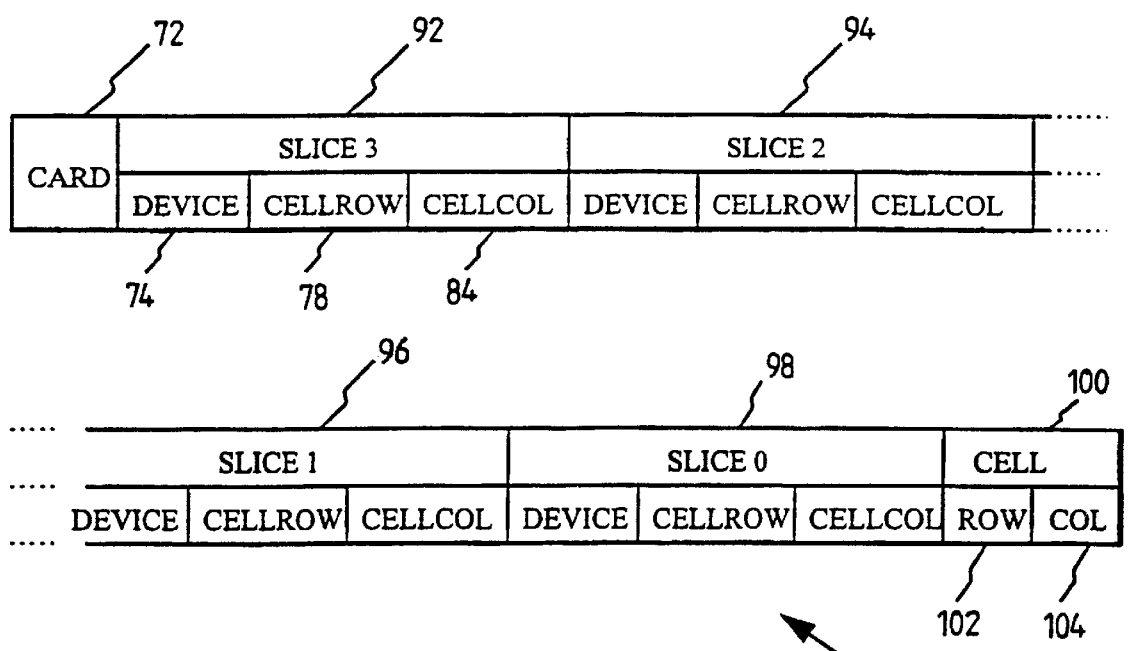
FIG. 8 illustrates the format of another type of address used in the system of FIG. 1.

A typical MSA 90 for the memory system 10 is shown in FIG. 8 and has six fields. The first field is the card address 72 which identifies which card 40 in the memory system 10 is being addressed, the next four fields are for each slice 44 and the sixth field is for the row and column address within each slice 44.

The second field 92 is the slice number three address field which has a device sub-field 74, a cell row sub-field 78, and a cell column sub-field 84 for identifying the device 42 and cell 50 being addressed within slice number three. Similarly, the third field 94 is the slice number two address field, the fourth field 96 is the slice number one address field, and the fifth field 98 is the slice number zero address field, each of these fields 94,96,98 having sub-fields for identifying the device 42 and cell 50 being addressed within the respective field.

The sixth field 100 has two sub-fields, a row sub-field 102 for identifying the row being addressed in each cell 50 and a column sub-field 104 for identifying the column being addressed in each cell 50. Each of the second, third, fourth, and fifth fields define the address within the respective memory slice to a resolution of one cell; whereas, the sixth field defines the row and column address within each of the cells. Thus, the same row and column location is addressed in each cell 50, even though a different cell 50 may be addressed in each slice 44.

In general, for a memory system having n different slices, the MSA 90 will have n+2 fields; although, if the card 72 and cell 100 fields are included in each of the slice fields then there would only be n fields. As an alternative, n different addresses could be generated which together constitute the MSA 90.

To construct the starting MSA 90 the translator 22 on a per slice basis reads the contents of the memory 23 for the device being accessed and increments the cell column field 84 and if necessary (i.e. if the end of a row is reached) also increments the cell row field 78 of the PBA 70 for each defective cell 52 present in the device at the same or a lower address than the address being accessed. For example, referring to FIG. 4, if the PBA 70 identifies row one column two as the cell to be addressed then the translator 22 constructs a MSA 90 (for the slice represented by FIG. 4) identifying row one column four, because there are two defective cells 52 having the same or a lower address; similarly, if the PBA 70 identifies row three column nine then the translator 22 constructs a MSA 90 identifying row four column one, because there are seven defective cells 52 having the same or a lower address than the original address and one defective cell 52 having an address between the PBA address and the newly-calculated address. The translator 22 uses the Dcell_G column 61 from the cell map of FIG. 5 as an aid in determining how many cells should be incremented to construct a MSA 90 from a PBA 70.

Once the translator 22 has constructed a complete MSA 90 (having a field for each slice 44) then the translator 22 determines how many data structures can be written (the data transfer burst length) before the transfer has to be halted and a new MSA 90 calculated.

The translator 22 determines the data transfer burst length by comparing the value of the column field 104 with the total number of columns in a cell 50. For example, if there are 256 columns in a cell and the column field 104 has a value of 64, then 192 locations can be written to in each slice 44; thus 192 data structures (three 512 byte data blocks) can be written before the end of the cell 50 is reached so the data transfer burst length will be at least 192 data structures for the current cell 50.

The translator 22 then determines for each slice 44 the location of the next defective cell 52, i.e. the defective cell 52 in each slice 44 occurring after the current cell 50. The translator 22 also determines how many cells after the current cell can be accessed before a special memory access cycle may be required, for example, a new page access (which may occur when a new row address has to be loaded) for DRAM devices. The translator 22 compares the number of cells before a defect is reached in one of the slices with the number of cells before a special memory access cycle is required, and chooses the lower of these two as the number of cells which can be accessed in a burst transfer.

When the translator 22 has determined the number of data structures which can be transferred before the transfer has to be halted, then the translator 22 loads internal counters with numbers representing the number of data structures in the first cell addressed by the MSA 90 which can be transferred and, if necessary, the number of cells thereafter which can be accessed before the transfer has to be halted.

For example, if the next cell (after the current cell) in one of the slices is defective, the data transfer burst length is 192 data structures and the translator 22 loads burst transfer registers 67 with the number 64 and after each memory access cycle the number in registers 67 is incremented until the number 255 is reached. The number in registers 67 is used to address the columns in the slices 44, i.e. the contents of registers 67 is used as the column field 104, which is incremented after each memory access cycle. When the registers 67 store the number 255 then the translator 22 causes the host address converter 21 to stop the total transfer counter 66.

By way of another example, when two cells after the current cell in each of the slices are non-defective (but the third cell is defective in one of the slices), then the data transfer burst length is 192 data structures plus two cells (which have 256 data structures per cell) so the translator 22 loads burst transfer registers 67 so that the number 704 can be counted. As before, the registers 67 are arranged so that the column field 104 is supplied by the contents of the registers 67. After each memory access cycle the number in registers 67 is incremented until the number 704 is reached, the translator 22 then causes the host address converter 21 to stop the total transfer counter 66.

Once the translator 22 has constructed the MSA 90 and determined the data transfer burst length then this information is conveyed to the data transfer unit 24 via an MSA bus 110.

The data transfer unit 24 applies the MSA 90 conveyed by the MSA bus 110 to memory 18. As described previously, the memory data and address buses are segmented into slices 44 so that a data bus slice relates uniquely to a specific memory slice 44. At the end of each burst transfer, the translator 22 stops the counter 66 and generates a new MSA.

During a write [read] operation, once the translator 22 has constructed the MSA 90 and determined the data transfer burst, the data transfer unit 24 applies the MSA 90 to each slice 44 in memory 18 and writes [reads] the respective data (having a length corresponding to the data transfer burst) for each slice 44 to [from] the memory 18. The translator 22 then constructs a new MSA 90 and determines a new data transfer burst length and applies this new information to the data transfer unit 24 where the writing [reading] procedure is repeated.

During a data transfer burst, the translator 22 increments the row and column addresses of the MSA 90 and where necessary the cell row and cell column addresses. Thus, the memory system 10 provides transfer of data in bursts. These data transfer bursts are synchronised on all of the data slices so that at any time during data transfer a valid sixty-four bit wide data word is present on the four slices 44; i.e. valid data words are always present on the full width of the memory system data bus 25.

When total transfer counter 66 reaches zero then the sequence of data blocks from the PC 12 has been fully transferred. Various modifications may be made to the above described embodiment within the scope of the present invention. For example, in other memory systems, additional slices may be used for storing control information such as error correcting codes. In other embodiments a greater or smaller number of slices than four may be used, for example, sixteen slices may be preferred. In other embodiments, data blocks of size other than 512 bytes may be used, for example 8192 bytes. In other embodiments, the address format shown in FIG. 8 may be modified for use in a time multiplexed addressing system where the row address is received at one point in time and the column address is received at a different point in time. In other embodiments, the ordering of physical blocks may not be the same as the ordering of logical blocks, in which case a look-up table may be used by the host address converter 21 to determine the PBA from the LBA. In the above embodiment, each card 40 is considered to be independent so that data blocks are stored entirely on one card 40 rather than partly on one card 40 and partly on another card 40, thus the card field 72 is identical for all of the slices 44; whereas, in other embodiments the card field may not be the same for all slices but the controller 17 may consider the address space as spanned by all of the cards. The advantage of independent translation for each card is that it allows a card to be a replaceable unit, with available memory capacities of slices balanced within each card (so that each slice has a similar capacity), and with a guaranteed minimum memory capacity on each card. It also allows easier relocation of data within a slice if a memory failure occurs during operation. A small amount of spare memory capacity, for example, a few cells, may be allocated within each slice on each card, and data relocation would be required only on a single slice on a single card. In other embodiments, a hardware pre-sequencer may be used having registers for storing the transfer start address and burst length. The pre-sequencer may have registers for storing multiple start addresses and multiple burst lengths so that transfer of data block slices spanning more than one cell 50 may be controlled by hardware in a single uninterrupted operation. In other embodiments, a new cell address may not be generated each time the end of a row in a cell is reached, as other embodiments may determine whether any cell in a slice is the last usable cell in a device and only in that event load a new cell address. In some embodiments, one or more of the devices in the memory may not have any defective locations; in such an embodiment, there may be no defect mapping means for that or those devices or the defect mapping means for that or those devices may indicate that there are no defective locations in that or those devices. In other embodiments, the defect mapping means 46 may not be located on the memory card 40 but may be located elsewhere in the memory system 10. In other embodiments, the translator 22 may only transfer data structures until the end of the cell So is reached. A new cell address is then generated by the translator 22. Thus, in the alternative embodiment, data is written to and read from the memory 18 in data transfer bursts, where each burst has a maximum length equal to the length of a row within a cell 50. In other embodiments, the interface to the memory devices may not require an address to be supplied on every memory access cycle, but may supply a burst of data on successive cycles from an initial address. Such a style of interface is easily implemented in the data transfer unit 24.

What is claimed is:

1. A memory system (10) comprising:
   a plurality of memory devices (42), where at least one of the memory devices has a defective memory location;
   defect mapping means (46) associated with each memory device having a defective location, for recording a representation of the location of the or each defective memory location;
   a controller (17) for accessing the defect mapping means and for writing data structures to and reading data structures from the memory devices; and
   host interface means (16) for conveying a host address and associated data structures between a host (12) and the controller;
   the system being arranged and configured so that data structures are divided into portions which are respectively stored in different memory devices, and, in use, the controller (17) converts the host address to an intermediate address for use in accessing a memory location in each of a plurality of said devices, accesses the defect mapping means using said intermediate address and thereby generates on a per device basis, for each device of said plurality of devices, a physical address corresponding to a non-defective location within that device by incrementing a first physical address in the physical address space of that device, which first address is determined from said intermediate address, by a number of addresses ordered sequentially after said first address according to a predetermined order of physical addresses in the physical address space of that device, so as to obtain a final physical address corresponding to a non-defective location in that device, the number of addresses by which said first address is incremented being related to the number of defective memory locations prior to said first address, and any defective locations between said first and final physical addresses, according to said predetermined order, whereby different physical addresses may be applied to different devices when a data structure is written to or read from the different devices.

2. A memory system according to claim 1, wherein the controller is arranged to organise the memory locations in each memory device (42) into cells (50) so that if any cell contains a defective memory location then the entire cell is considered to be defective.

3. A memory system according to claim 1, wherein the controller (17) has a host address converter (21) for converting the host address to said intermediate address, a translator (22) for accessing the defect mapping means (46) and constructing said final physical address for a non-defective memory location for each device (42) using the intermediate address and where necessary the defect mapping means, and a data transfer unit (24) for applying the final physical addresses to the respective devices.

4. A memory system according to claim 3, wherein the translator (22) also determines the number of data structures which may be transferred in an uninterrupted sequence.

5. A memory system according to claim 1, wherein the defect mapping means (46) is in the form of a non-volatile memory.

6. A memory system according to claim 5, wherein the defect mapping means (46) comprises a programmable read-only memory (PROM).

7. A memory system according to claim 5, wherein the defect mapping means (46) for each device having a defective location is located on a single FLASH EPROM.

8. A memory system according to claim 2, wherein the defect mapping means (46) has an entry for each cell in each of the memory devices.

9. A memory system according to claim 1, wherein the memory devices are DRAM devices (42).

10. A memory system according to claim 1, wherein said predetermined order of physical addresses comprises the physical addresses ordered sequentially according to increasing physical address, from the lowest physical address to the highest physical address.

11. A controller (17) for use with a memory system (10) having a plurality of memory devices (42), at least one of the devices having a defective memory location, and the system having defect mapping means (46) associated with each memory device having a defective location, where the system is arranged and configured so that each data structure is divided into portions which are respectively stored in different memory devices, the controller (17) being arranged for converting the host address to an intermediate address for use in accessing a memory location in each of a plurality of said devices, accessing the defect mapping means using said intermediate address and thereby generating on a per device basis, for each device of said plurality of devices, a physical address corresponding to a non-defective location within that device by incrementing a first physical address in the physical address space of that device, which first physical is determined from said intermediate address, by a number of addresses ordered sequentially after said first address according to a predetermined order of physical addresses in the physical address space of that device, so as to obtain a final physical address corresponding to a non-defective location in that device, the number of addresses by which said first address is incremented being related to the number of defective memory locations prior to said first address, and any defective locations between said first and final physical addresses, according to said predetermined order, whereby different physical addresses may be applied to different devices when a data structure is written to or read from the different devices.

12. A method of storing and retrieving data structures, where the data structures are divided into portions which are respectively stored in different memory devices (42); the method comprising the steps of:

provimg a plurality of memory devices (42), where at least one of the memory devices has a defective memory location;

providing defect mapping means (46) associated with each memory device having a defective location;

on a per device basis, determining with reference to any defect mapping means (46) associated with that device (42) an address of a non-defective memory location within that device by converting the host address to an intermediate address for use in accessing a memory location in each of said plurality of devices, accessing the defect mapping means using said intermediate address and thereby generating on a per device basis, for each device of said plurality of devices, a physical address corresponding to a non-defective location within that device by incrementing a first physical address in the physical address space of that device, which first physical is determined from said intermediate address, by a number of physical addresses ordered sequentially after said first address according to a predetermined order of physical addresses in the physical address space of that device, so as to obtain a final physical address corresponding to a non-defective location in that device, the number of addresses by which said first address is incremented being related to the number of defective memory locations prior to said first address, and any defective locations between said first and final physical addresses, according to said predetermined order;

applying the respective determined final physical addresses to the devices; and one of reading a data structure from and writing a data structure to the respective memory locations accessed by the respective determined final physical addresses.

* * * * *